(12) United States Patent
Jeong

(10) Patent No.: US 9,355,695 B2
(45) Date of Patent: May 31, 2016

(54) SEMICONDUCTOR MEMORY DEVICE AND METHOD OF TESTING THE SAME

(71) Applicant: SK hynix Inc., Gyeonggi-do (KR)

(72) Inventor: Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 56 days.

(21) Appl. No.: 14/526,255

(22) Filed: Oct. 28, 2014

(65) Prior Publication Data

US 2016/0005445 A1 Jan. 7, 2016

(30) Foreign Application Priority Data

Jul. 2, 2014 (KR) .......................... 10-2014-0082518

(51) Int. Cl.
*G11C 8/10* (2006.01)
*G11C 7/22* (2006.01)
*G11C 29/00* (2006.01)
*G11C 8/16* (2006.01)

(52) U.S. Cl.
CPC *G11C 7/22* (2013.01); *G11C 29/00* (2013.01); *G11C 8/10* (2013.01); *G11C 8/16* (2013.01)

(58) Field of Classification Search
CPC ............ G11C 7/22; G11C 29/00; G11C 8/10; G11C 8/16; G11C 8/18

USPC .......................................................... 365/194
See application file for complete search history.

(56) References Cited

U.S. PATENT DOCUMENTS 5,357,471 A * 10/1994 Alapat .................. G11C 29/02
365/189.15

FOREIGN PATENT DOCUMENTS

KR 1020020057355 7/2002

* cited by examiner

*Primary Examiner* — Han Yang
*Assistant Examiner* — Xiaochun L Chen
(74) *Attorney, Agent, or Firm* — IP & T Group LLP

(57) ABSTRACT

A semiconductor memory device includes a row input section suitable for receiving a first row signal including a first row command and a first row address, corresponding to an active command, during a test operation of the active command, a column input section suitable for receiving a second row signal including a second row address corresponding to the active command during the test operation of the active command, and a signal control section suitable for generating an internal row signal for an operation of the active command by transforming the first row signal and the second row signal outputted from the row input section and the column input section.

15 Claims, 6 Drawing Sheets

SEMICONDUCTOR MEMORY DEVICE AND METHOD OF TESTING THE SAME

CROSS-REFERENCE TO RELATED APPLICATIONS

The present application claims priority of Korean Patent Application No. 10-2014-0082518, filed on Jul. 2, 2014, which is incorporated herein by reference in its entirety.

BACKGROUND

1. Field

Various exemplary embodiments of the present invention relate to a semiconductor design technology, and more particularly, to a semiconductor memory device.

2. Description of the Related Art

System in package (SIP) technique, by which a controller and a memory device is packaged in a single package, was introduced as the performance and the speed of a semiconductor memory device increase. Since there is a limit in increasing the input/output speed of single data in the semiconductor memory device, the number of input/output pins is expanded to increase the overall bandwidth thereof. A high bandwidth memory (HBM) device processes a large amount of data at a high speed through the expanded number of input/output pins.

The HBM may have 8 channels, each of which has 128 input/output pins and operates independently. Also, the HBM comprises a base die and a core die. The core die includes a lot of memory cells and the base die performs data communication with a controller.

The HBM, unlike a general double data rate (DDR) dynamic random access memory device, does not have a separated command pin and receives a command signal through some of the address pins. An address of the HBM is classified into a row address RA and a column address CA, and has 0.5 tCK of a valid data window tDV as a double data rate (DDR) instead of 1 tCK of the valid data window tDV as a single data rate (SDR). These particular structures of HBM reduce the number of address pins by replacing the command pin with the address pin and by processing the addresses at the double data rate. Also, the classification of the row address and the column address gets both of the row address and the column address simultaneously processed for fast access to the semiconductor memory device.

For testing the HBM, all of the row addresses and the column addresses may be set, and a tester for the HBM may input commands and addresses to the HBM within 1 tCK. A row command and a column command are inputted within 1 tCK. However, an active command among the row commands may be inputted through 2 tCK since there are lots of row addresses corresponding to the active command.

For this reason, the typical HBM has 2 row address pins for a rising address and a falling address, respectively, and the tester for the HBM inputs the active command through the 2 row address pins within 2 tCK.

During the input of the active command, the column address pins of the HBM are not used.

Therefore, there are needs for reducing the number of row address pins assigned to the input of the active command, and using column address pins for the input of the active command.

SUMMARY

Various embodiments of the present invention are directed to a semiconductor memory device utilizing a column address pin for input of an active command and reducing row address pins assigned to the input of the active command during a test.

In accordance with an embodiment of the present invention, a semiconductor memory device may include a row input section suitable for receiving a first row signal including a first row command and a first row address, corresponding to an active command, during a test operation of the active command, a column input section suitable for receiving a second row signal including a second row address corresponding to the active command during the test operation of the active command, and a signal control section suitable for generating an internal row signal for an operation of the active command by transforming the first row signal and the second row signal outputted from the row input section and the column input section.

The signal control section may include a first delay unit suitable for generating a plurality of active delay signals, which are sequentially outputted, by delaying the active command by a predetermined amount of time based on a clock signal, an active command control unit suitable for generating a plurality of selection control signals, which are sequentially enabled, by performing a logic combination of the plurality of active delay signals, a second delay unit suitable for delaying the second row signal by a predetermined amount of time to output a delay row signal, a row output unit suitable for outputting one of the first row signal and the delay row signal based on the plurality of selection control signals, and a column output unit suitable for outputting one of a power supply voltage and the second row signal based on the plurality of selection control signals.

The row input section may receive the first row signal through a row address pin.

The column input section may receive the second row signal through a column address pin.

The signal control section further may include a clock control unit suitable for generating a plurality of delay clock signals by delaying the clock signal by a predetermined amount of time based on a test mode signal.

The signal control section further may include a command decoding unit suitable for generating the active command based on the first row signal and the second row signal.

The row input section may receive a third row signal including a second row command except for the active command, and a third row address corresponding to the second row command during a test operation of the second row command except for the active command.

The column input section may receive a column signal including a column command and a column address during a test operation of the column command.

The row input section may receive the first and third row signals during a normal operation.

The semiconductor memory device may further include a selection section suitable for selecting one of the test operation and the normal operation.

In accordance with an embodiment of the present invention, a semiconductor memory device may include a memory core section suitable for performing an operation based on a command and an address, and a signal control section suitable for receiving a part of an active signal through a row address pin and the rest of the active signal through a column address pin, transforming the active signal into an internal active signal, and outputting the internal active signal to the memory core section as the command and the address, for a test operation of the active signal, wherein the active signal includes an active command and an active address corresponding to the active command.

The signal control section may include a first delay unit suitable for generating a plurality of active delay signals, which are sequentially outputted, by delaying the active command by a predetermined amount of time based on a clock signal, an active command control unit suitable for generating a plurality of selection control signals, which are sequentially enabled, by performing a logic combination of the plurality of active delay signals, a second delay unit suitable for delaying the rest of the active signal received through the column address pin by a predetermined amount of time, and outputting a delayed active signal, a row output unit suitable for outputting one of the part of the active signal received through the row address pin, and the delayed active signal based on the plurality of selection control signals, and a column output unit suitable for outputting one of a power supply voltage and the rest of the active signal received through the column address pin based on the plurality of selection control signals.

The signal control section may further include a command decoding unit suitable for generating the active command based on the active signal received through the row address pin and the column address pin.

In accordance with an embodiment of the present invention, a method of testing a semiconductor memory device may include simultaneously receiving an active command information through a row address pin and a column address pin, shifting the active command information received through the column address pin, generating an internal row signal corresponding to the active command information by sequentially outputting the active command information received through the row address pin, and a shifted active command information, and performing a test operation to the active command information based on the internal row signal corresponding to the active command information.

The simultaneously receiving of the active command information may include receiving a first row signal including a row command and a first row address, corresponding to an active command, through the row address pin, and receiving a second row signal including a second row address corresponding to the active command through the column address pin.

In accordance with the embodiments of the present invention, a semiconductor memory device may utilize a column address pin for input of an active command and reduce row address pins assigned to the input of the active command during a test.

DETAILED DESCRIPTION

Figure 1:
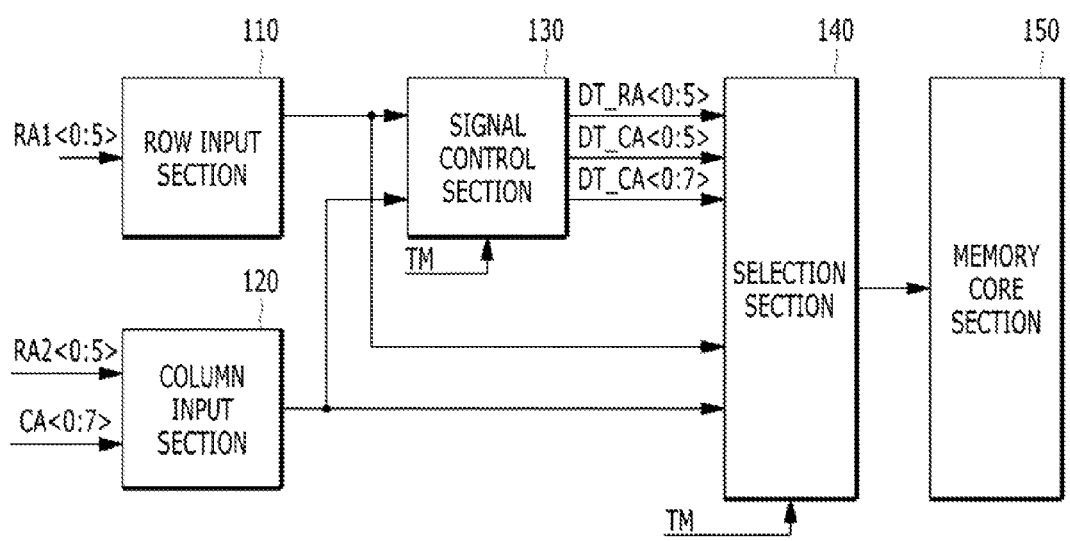
FIG. 1 is a block diagram illustrating a semiconductor memory device in accordance with an exemplary embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated in order to clearly illustrate features of the embodiments. Throughout the disclosure, reference numerals correspond directly to the like parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a block diagram illustrating a semiconductor memory device in accordance with an exemplary embodiment of the present invention.

Referring to FIG. 1, the semiconductor memory device may include a row input section 110, a column input section 120, a signal control section 130, a selection section 140, and a memory core section 150.

The row input section 110 and the column input section 120 may receive signals including commands and addresses in respective ways for first and second test modes during test operations. During the first test mode, the semiconductor memory device may perform the test operations in response to a row signal including row commands except for an active command and row addresses corresponding to the row commands, and a column signal including column commands and column addresses. During the second test mode, the semiconductor memory device may perform the test operations in response to a row signal including a row command and row addresses, corresponding to the active command.

During the first test mode, the row input section 110 may receive a first row signal RA1<0:5> including the row addresses and the row commands except for the active command through a row address pin. During the first test mode, the column input section 120 may receive a column signal CA<0:7> including the column commands and the column addresses through a column address pin.

During the second test mode, the row Input section 110 and the column input section 120 may simultaneously receive a row signal including the row command and the row address, corresponding to the active command, through the row address pin and the column address pin. The row command (or the active command) and the row address corresponding to the active command may be a first row signal RA1<0:5> and a second row signal RA2<0:5>.

In other words, during the first test mode, the first row signal RA1<0:5> including the row addresses and the row commands except for the active command of the semiconductor memory device may be tested. During the first test mode, the row input section 110 and the column input section 120 may receive the first row signal RA1<0:5> including the row addresses and the row commands except for the active command, and the column signal CA<0:7> including the column commands and the column addresses. Also, during the second test mode, the active command and the row addresses corresponding to the active command of the semiconductor memory device may be tested. During the second test mode, the row input section 110 and the column input section 120 may simultaneously receive the first row signal RA1<0:5> and the second row signal RA2<0:5> corresponding to the active command. That is to say, the row input section 110 and the column input section 120 may receive the row signal including the active command and the row address corresponding to the active command as the first row signal RA1<0:5> and the second row signal RA2<0:5>. The active command may be originally inputted through 2 tCK while a tester for the test operation may input the commands and the addresses within 1 tCK. Therefore, the semiconductor memory device in accordance with an exemplary embodiment of the present invention may simultaneously use the row address pin and the column address pin in order to receive the active command and the row address corresponding to the active command within 1 tCK.

Although it is described that the second row signals RA2<0:5> and the column signal CA<0:7> may be separately inputted, the second row signal RA2<0:5> and the column signal CA<0:7> may be inputted through the same address pin, for example, the column address pin.

During a normal operation other than the first and second test mode, the row input section 110 may receive the first row signal RA1<0:5> including the row addresses and the row commands including the active command through the row address pin, and the column input section 120 may receive the column signal CA<0:7> including the column commands and the column addresses through the column address pin.

The signal control section 130 may transform and output the signals inputted through the row input section 110 and the column input section 120 in response to a test mode signal TM in order to perform the test operation according to the first and second test modes. In other words, the signal control section 130 may transform the row signal including the active command and the column signal, which are inputted within 1 tCK, into an internal row signal DT_RA<0:5> and internal column signals DT_CA<0:5> and DT_CA<0:7>, and may output the internal row signal DT_RA<0:5> and the internal column signals DT_CA<0:5> and DT_CA<0:7>. The signal control section 130 may output the internal column signal DT_CA<0:7> of 8 bits for operations according to the column commands other than the active command between the internal column signals DT_CA<0:5> and DT_CA<0:7> during the first test mode. The signal control section 130 may output the Internal column signal DT_CA<0:5> of 6 bits for an operation according to the active command between the internal column signals DT_CA<0:5> and DT_CA<0:7> during the second test mode.

A detailed description for the signal control section 130 will be set forth with reference to FIG. 2.

The selection section 140 may select one of the test operation and the normal operation in response to the test mode signal TM. During the test operation, the selection section 140 may transfer the internal row signal DT_RA<0:5> and the internal column signals DT_CA<0:5> and DT_CA<0:7> outputted from the signal control section 130 to the memory core section 150 which will be described later. During the normal operation, the selection section 140 may transfer the row signal and the column signal outputted from the row input section 110 and the column input section 120 to the memory core section 150. The test mode signal TM may be inputted from a mode register set (MRS) or from an external.

The memory core section 150 may perform one of the test operation and the normal operation in response to the signal outputted from the selection section 140.

To sum up, during the first test mode, the row input section 110 may receive the first row signal RA1<0:5> including the row addresses and the row commands except for the active command through the row address pin, and the column input section 120 may receive the column signal CA<0:7> including the column commands and the column addresses through the column address pin. After that, the signal control section 130 may transform the first row signal RA1<0:5> and the column signal CA<0:7> into the internal row signal DT_RA<0:5> and the internal column signal DT_CA<0:7>, and output the internal row signal DT_RA<0:5> and the internal column signal DT_CA<0:7>.

Also, during the second test mode, the row input section 110 and the column input section 120 may simultaneously receive the row signal, including the active command and the row address, corresponding to the active command, as the first row signal RA1<0:5> and the second row signal RA2<0:5>, through the row address pin and the column address pin. After that, the signal control section 130 may transform the first row signal RA1<0:5> and the second row signal RA2<0:5> into the internal row signal DT_RA<0:5> and the internal column signal DT_CA<0:5>, and output the internal row signal DT_RA<0:5> and the internal column signal DT_CA<0:5>.

Figure 2:
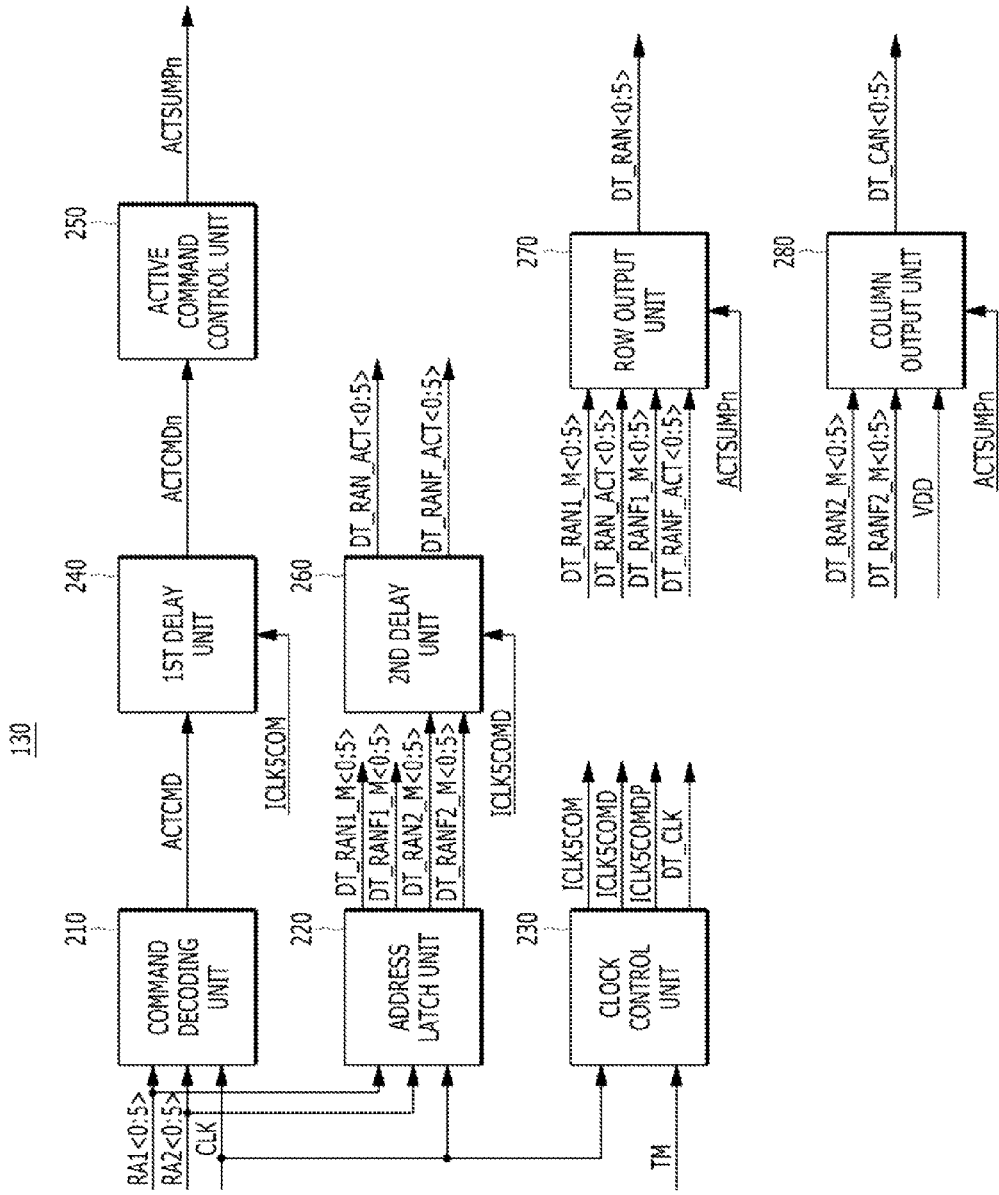
FIG. 2 is a block diagram illustrating a signal control section shown in FIG. 1.

FIG. 2 is a block diagram illustrating the signal control section 130 shown in FIG. 1.

Referring to FIG. 2, the signal control section 130 may include a command decoding unit 210, an address latch unit 220, a clock control unit 230, a first delay unit 240, a second delay unit 260, an active command control unit 250, a row output unit 270, and a column output unit 280.

The command decoding unit 210 may operate in response to different signals according to the first and second test modes. FIG. 2 shows that the command decoding unit 210 receives the first row signal RA1<0:5> and the second row signal RA2<0:5> for the second test mode. During the second test mode, the command decoding unit 210 may generate the active command ACTCMD by decoding the first row signal RA1<0:5> and the second row signal RA2<0:5> inputted from the column input section 120 based on a clock signal CLK. The first row signal RA1<0:5> may include command information and address information corresponding to the active command ACTCMD, and the second row signal RA2<0:5> may include address information corresponding to the active command ACTCMD.

During the first test mode, the command decoding unit 210 may generate the column command (not illustrated) and the row command (not illustrated) except for the active command ACTCMD by decoding the first row signal RA1<0:5> and the column signal CA<0:7>, inputted from the row input section 110 and the column input section 120, based on the clock signal CLK.

The address latch unit 220 may latch each of the first row signal RA1<0:5> and the second row signal RA2<0:5> at the rising edge and the falling edge of the clock signal CLK, and may output rising and falling address signals DT_RAN1_M<0:5>, DT_RANF1_M<0:5>, DT_RAN2_M<0:5>, and DT_RANF2_M<0:5> corresponding to the first row signal RA1<0:5> and the second row signal RA2<0:5>. The address latch unit 220 may output a first rising row address DT_RAN1_M<0:5> and a first falling row address DT_RANF1_M<0:5> corresponding to the first row signal RA1<0:5> and respectively latched at the rising and falling edges of the clock signal CLK. The address latch unit 220 may output a second rising row address DT_RAN2_M<0:5> and a second falling row address DT_RANF2_M<0:5> corresponding to the second row signal RA2<0:5> and respectively latched at the rising and falling edges of the clock signal CLK.

During the first test mode, the address latch unit 220 may latch the first row signal RA1<0:5> corresponding to the row commands except for the active command ACTCMD or the column signal CA<0:7>, and may generate the row address and the column address.

The clock control unit 230 may generate an internal clock signal ICLK5COM and a plurality of delay clock signals ICLK5COMD, ICDKCOMDP, DT_CLK from the clock signal CLK based on the test mode signal TM. A detailed description for the clock control unit 230 will be set forth with reference to FIG. 3.

The first delay unit 240 may generate a plurality of active delay signals ACTCMDn, which are sequentially enabled based on the Internal clock signal ICLK5COM, from the active command ACTCMD outputted from the command decoding unit 210.

The active command control unit 250 may generate a plurality of selection control signals ACTSUMPn, which are sequentially enabled, by performing a logic combination of the plurality of active delay signals ACTCMDn outputted from the first delay unit 240.

The second delay unit 260 may receive the second rising row address DT_RAN2_M<0:5> and the second falling row address DT_RANF2_M<0:5> from the address latch unit 220, and may shift the second rising row address DT_RAN2_M<0:5> and the second falling row address DT_RANF2_M<0:5> based on the delay clock signal ICLK5COMD outputted from the clock control unit 230. The first row signal RA1<0:5> and the second row signal RA2<0:5> corresponding to the active command ACTCMD may be simultaneously inputted within 1 tCK. However, the active command ACTCMD should be processed through the time length of 2 tCK, and therefore the first row signal RA1<0:5> and the second row signal RA2<0:5> corresponding to the active command ACTCMD and having the time length of 1 tCK should be transformed to have the time length of 2 tCK. Therefore, the semiconductor memory device in accordance with an exemplary embodiment of the present invention may shift the second rising row address DT_RAN2_M<0:5> and the second falling row address DT_RANF2_M<0:5>, which are inputted at the same time as the first rising row address DT_RAN1_M<0:5> and the first falling row address DT_RANF1_M<0:5>, and may output a delay rising row address DT_RAN_ACT<0:5> and a delay falling row address DT_RANF_ACT<0:5>.

Detailed description for the first delay unit 240, the second delay unit 260, and the active command control unit 250 will be set forth with reference to FIG. 5.

The row output unit 270 may output one between a pair of the first rising row address DT_RAN1_M<0:5> and the first falling row address DT_RANF1_M<0:5>, which are outputted from the address latch unit 220, and a pair of the delay rising row address DT_RAN_ACT<0:5> and the delay falling row address DT_RANF_ACT<0:5>, which are outputted from the second delay unit 260, as an internal row signal DT_RAN<0:5> based on the plurality of selection control signals ACTSUMPn outputted from the active command control unit 250. The row output unit 270 may output the internal row signal DT_RAN<0:5> through 2 tCK for the operation of the active command ACTCMD. The internal row signal DT_RAN<0:5> may be inputted to the memory core section 150.

The column output unit 280 may output one of a power supply voltage VDD and a pair of the second rising row address DT_RAN2_M<0:5> and the second falling row address DT_RANF2_M<0:5>, which are outputted from the address latch unit 220, as an internal column signal DT_CAN<0:5> based on the plurality of selection control signals ACTSUMPn outputted from the active command control unit 250. The internal column signal DT_CAN<0:5> outputted from the column output unit 280 may be inputted to the memory core section 150.

During the second test mode where the first row signal RA1<0:5> and the second row signal RA2<0:5> corresponding to the active command ACTCMD are inputted to the row input section 110 and the column input section 120, each of the internal row signal DT_RAN<0:5> and the internal column signal DT_CAN<0:5> may include 6 bits. During the first test mode where the first row signal RA1<0:5> and the column signal CA<0:7> respectively corresponding to the row commands except for the active command ACTCMD and the column commands are inputted, the column output unit 280 may output an internal column signal (not illustrated) including bits corresponding to the column signal CA<0:7>.

Detailed descriptions for the row output unit 270 and the column output unit 280 will be set forth with reference to FIG. 5.

Detailed descriptions for operation of the signal control section 130 will be set forth with reference to FIG. 6.

Figure 3:
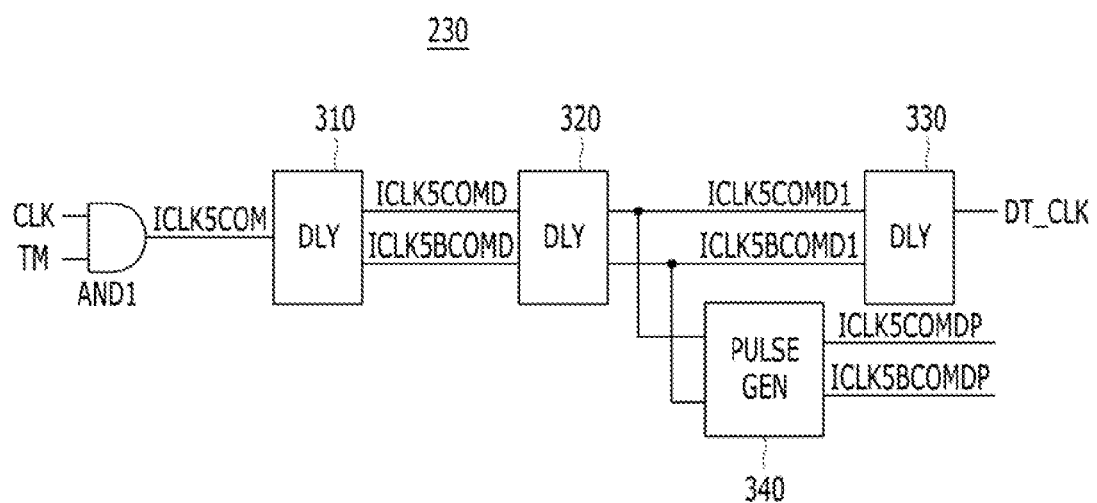
FIG. 3 is a block diagram illustrating a clock control unit shown in FIG. 2.

FIG. 3 is a block diagram illustrating the clock control unit 230 shown in FIG. 2.

Referring to FIG. 3, the clock control unit 230 may include an AND gate AND1, a plurality of delay circuits 310 to 330, and a pulse generator 340.

The clock signal CLK may enable the internal clock signal ICLK5COM as the test mode signal TM is enabled. The internal clock signal ICLK5COM may be inputted to the first delay unit 240. The plurality of delay circuits 310 to 330 may shift the internal clock signal ICLK5COM and may generate a plurality of delay clock signals ICLK5COMD, ICLK5COMD1, and DT_CLK. A first delay clock signal ICLK5COMD and a first inverted delay clock signal ICLK5BCOMD outputted from the first delay circuit 310 among the plurality of delay circuits 310 to 330 may be inputted to the second delay unit 260.

The pulse generator 340 may generate a pulse signal ICLK5COMDP in response to a second delay clock signal ICLK5COMD1 and a second inverted delay clock signal ICLK5BCOMD1 outputted from the second delay circuit 320 among the plurality of delay circuits 310 to 330. The pulse signal ICLK5COMDP and the inverted pulse signal ICLK5BCOMDP outputted from the pulse generator 340 may be inputted to the row output unit 270 and the column output unit 280, which will be described in detail with reference to FIG. 4.

Figure 4:
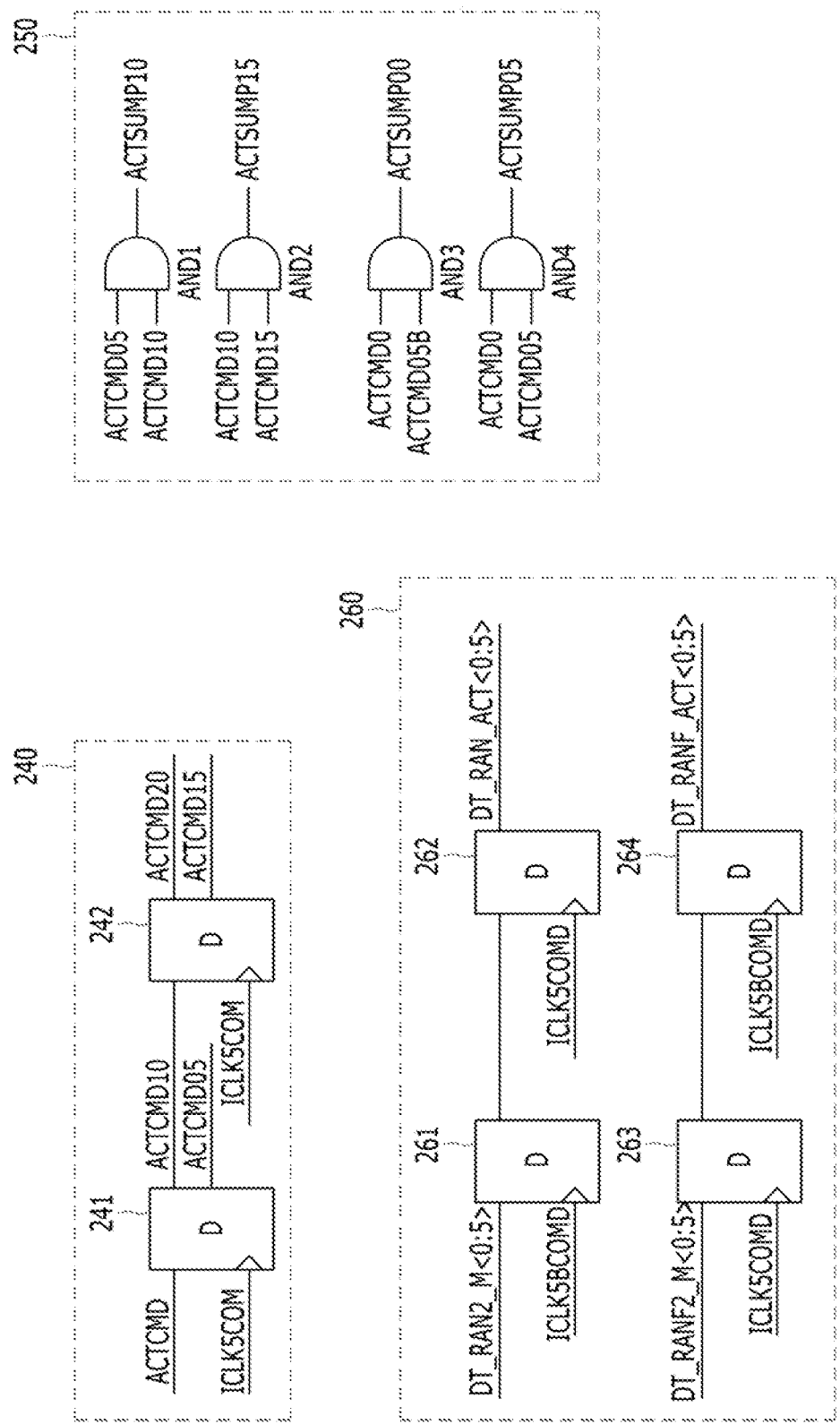
FIG. 4 is a block diagram illustrating first and second delay units and an active command control unit shown in FIG. 2.

FIG. 4 is a block diagram illustrating the first and second delay units 240 and 260 and the active command control unit 250 shown in FIG. 2.

Referring to FIGS. 2 to 4, the first delay unit 240 may include 2 delay circuits 241 and 242. The 2 delay circuits 241 and 242 may output the plurality of active delay signals ACTCMD05, ACTCMD10, ACTCMD15, and ACTCMD20 by sequentially shifting the active command ACTCMD, which is outputted from the command decoding unit 210, based on the internal clock signal ICLK5COM. The active command ACTCMD may be delayed by an amount of 0.5 tCK to become the first active delay signal ACTCMD05 among the plurality of active delay signals ACTCMD05, ACTCMD10, ACTCMD15, and ACTCMD20. The active command ACTCMD may be delayed by an amount of 1 tCK to become the second active delay signal ACTCMD10 among the plurality of active delay signals ACTCMD05, ACTCMD10, ACTCMD15, and ACTCMD20. The active command ACTCMD may be delayed by an amount of 1.5 tCK to become the third active delay signal ACTCMD15 among the plurality of active delay signals ACTCMD05, ACTCMD10, ACTCMD15, and ACTCMD20. The active command ACTCMD may be delayed by an amount of 2 tCK to become the fourth active delay signal ACTCMD20 among the plurality of active delay signals ACTCMD05, ACTCMD10, ACTCMD15, and ACTCMD20.

The active command control unit 250 may include a plurality of AND gates AND1, AND2, AND3, and AND4, and may generate the plurality of selection control signals ACTSUMP00, ACTSUMP05, ACTSUMP10, and ACTSUM15, which are sequentially enabled, by performing a logic combination of the plurality of active delay signals ACTCMD05, ACTCMD10, ACTCMD15, and ACTCMD20 outputted from the first delay unit 240. The plurality of selection control signals ACTSUMP00, ACTSUMP05, ACTSUMP10, and ACTSUM15 may be inputted to the row output unit 270 and the column output unit 280 as control signals.

The second delay unit 260 may include a plurality of delay circuits 261, 262, 263, and 264. The first and second delay circuits 261 and 262 among the plurality of delay circuits 261, 262, 263, and 264 may generate the delay rising row address DT_RAN_ACT<0:5> by shifting the second rising row address DT_RAN2_M<0:5>, which is outputted from the address latch unit 220, based on the delay clock signal ICLK5COMD and the inverted delay clock signal ICLK5BCOMD. The third and fourth delay circuits 263 and 264 among the plurality of delay circuits 261, 262, 263, and 264 may generate the delay falling row address DT_RANF_ACT<0:5> by shifting the second falling row address DT_RANF2_M<0:5>, which is outputted from the address latch unit 220, based on the delay clock signal ICLK5COMD and the inverted delay clock signal ICLK5BCOMD.

Figure 5:
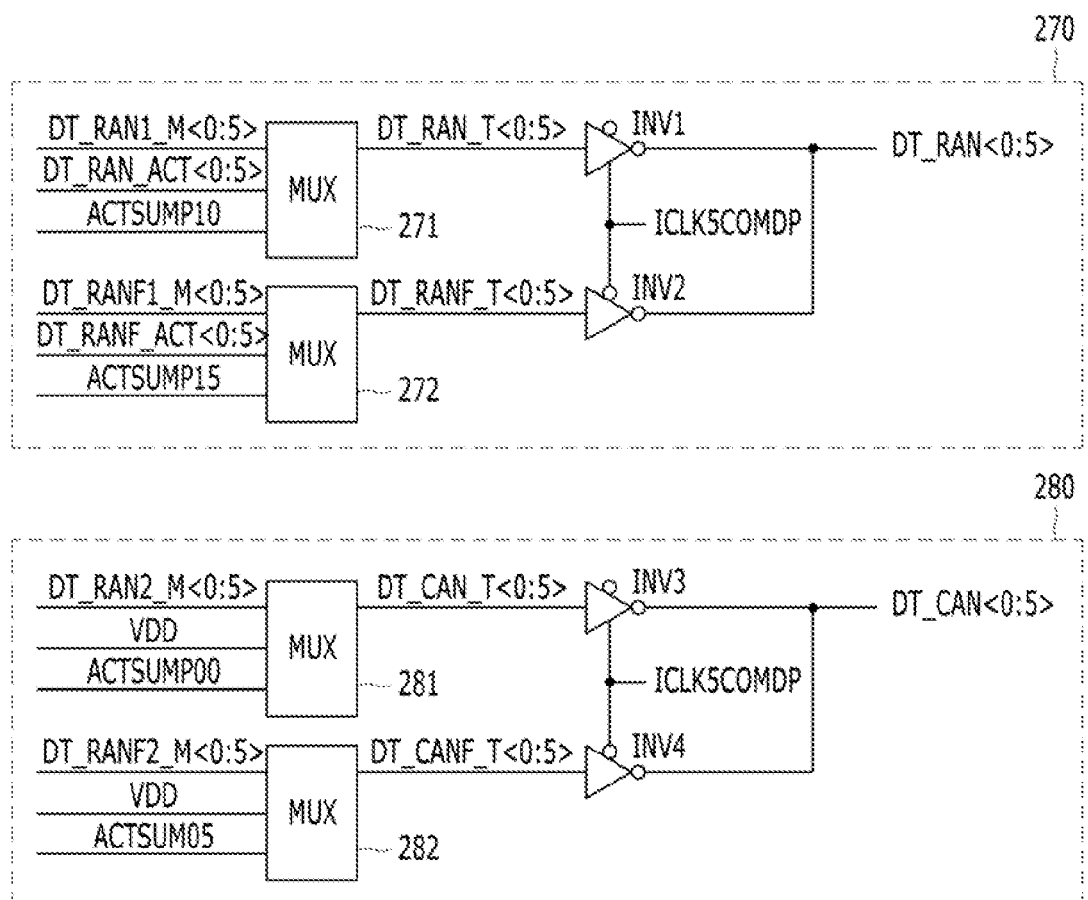
FIG. 5 is a block diagram illustrating a row output unit and a column output unit shown in FIG. 2.

FIG. 5 is a block diagram illustrating the row output unit 270 and the column output unit 280 shown in FIG. 2.

The row output unit 270 may include 2 MUXs 271 and 272 and 2 tri-state inverters INV1 and INV2. The column output unit 280 may include 2 MUXs 281 and 282 and 2 tri-state inverters INV3 and INV4.

In the row output unit 270, the first MUX 271 between the first and second MUXs 271 and 272 may output one of the first rising row address DT_RAN1_M<0:5> and the delay rising row address DT_RAN_ACT<0:5> as a first output signal DT_RAN_T<0:5> based on the third selection control signal ACTSUMP10 among the plurality of selection control signals ACTSUMP00, ACTSUMP05, ACTSUMP10, and ACTSUM15 outputted from the active command control unit 250. The second MUX 272 between the first and second MUXs 271 and 272 may output one of the first falling row address DT_RANF1_M<0:5> and the delay falling row address DT_RANF_ACT<0:5> as a second output signal DT_RANF_T<0:5> based on the fourth selection control signal ACTSUMP15 among the plurality of selection control signals ACTSUMP00, ACTSUMP05, ACTSUMP10, and ACTSUM15 outputted from the active command control unit 250. The first and second output signals DT_RAN_T<0:5> and DT_RANF_T<0:5> outputted from the first and second MUXs 271 and 272 may be inputted to the tri-state inverters INV1 and INV2, and may be outputted based on the pulse signal ICLK5COMDP.

In the column output unit 280, the first MUX 281 between the first and second MUXs 281 and 282 may output one of the second rising row address DT_RAN2_M<0:5> and the power supply voltage VDD as a first output signal DT_CAN_T<0:5> based on the first selection control signal ACTSUMP10 among the plurality of selection control signals ACTSUMP00, ACTSUMP05, ACTSUMP10, and ACTSUM15 outputted from the active command control unit 250. The second MUX 281 between the first and second MUXs 281 and 282 may output one of the second falling row address DT_RANF2_M<0:5> and the power supply voltage VDD as a second output signal DT_CANF_T<0:5> based on the second selection control signal ACTSUMP05 among the plurality of selection control signals ACTSUMP00, ACTSUMP05, ACTSUMP10, and ACTSUM15 outputted from the active command control unit 250. The first and second output signals DT_CAN_T<0:5> and DT_CANF_T<0:5> outputted from the first and second MUXs 281 and 282 may be inputted to the tri-state inverters INV3 and INV4, and may be outputted based on the pulse signal ICLK5COMDP.

During the second test mode, the column output unit 280 may output one of the power supply voltage VDD and the pair of the second rising row address DT_RAN2_M<0:5> and the second falling row address DT_RANF2_M<0:5> in response to the second row signal RA2<0:5> corresponding to the active command ACTCMD. During the first test mode where the semiconductor memory device receives the column signal CA<0:7> corresponding to the column commands other than the active command ACTCMD such as read and write commands, the column output unit 280 may output one of the power supply voltage VDD and a pair of a rising column address (not Illustrated) and a falling column address (not Illustrated) corresponding to the column signal CA<0:7> having 8 bits as an Internal column signal (not Illustrated) having 8 bits.

Figure 6:
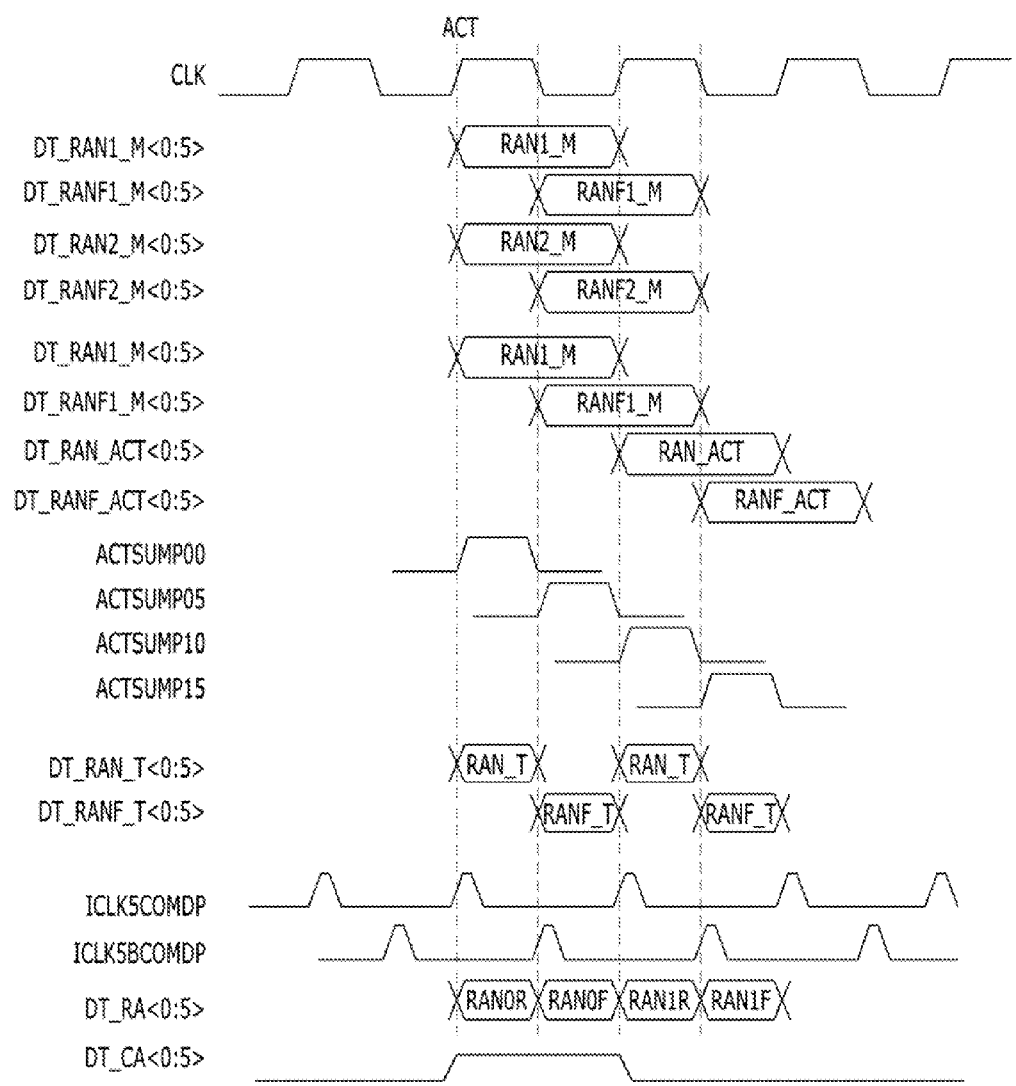
FIG. 6 is a timing diagram illustrating the operation of the signal control section shown in FIG. 2.

FIG. 6 is a timing diagram illustrating the operation of the signal control section 130 shown in FIG. 2.

FIG. 6 shows the test operation to the active command ACTCMD.

Referring to FIGS. 2 to 6, the active command ACTCMD may be outputted from the command decoding unit 210.

The address latch unit 220 may latch each of the first row signal RA1<0:5> and the second row signal RA2<0:5>, which are simultaneously inputted from an external, at the rising edge and the falling edge of the clock signal CLK, and may output the first rising row address DT_RAN1_M<0:5>, the first falling row address DT_RANF1_M<0:5>, the second rising row address DT_RAN2_M<0:5>, and the second falling row address DT_RANF2_M<0:5>.

When the active command ACTCMD is enabled, the first rising row address DT_RAN1_M<0:5> and the first falling row address DT_RANF1_M<0:5> may be inputted at the same time as the second rising row address DT_RAN2_M<0:5> and the second falling row address DT_RANF2_M<0:5>, respectively.

The active command ACTCMD may be originally inputted through 2 tCK while the tester for the test operation may input the commands and the addresses within 1 tCK. Therefore, the semiconductor memory device in accordance with an exemplary embodiment of the present invention may simultaneously use the row address pin and the column address pin in order to receive the active command and the row address corresponding to the active command within 1 tCK.

Therefore, the second delay unit 260 may shift each of the second rising row address DT_RAN2_M<0:5> and the second falling row address DT_RANF2_M<0:5>, which are inputted at the same time as the first rising row address DT_RAN1_M<0:5> and the first falling row address DT_RANF1_M<0:5>, by an amount of 1 tCK, and may output the delay rising row address DT_RAN_ACT<0:5> and the delay falling row address DT_RANF_ACT<0:5>.

The row output unit 270 may output the internal row signal DT_RAN<0:5> by sequentially outputting the first rising row address DT_RAN1_M<0:5>, the first falling row address DT_RANF1_M<0:5>, the delay rising row address DT_RAN_ACT<0:5>, and the delay falling row address DT_RANF_ACT<0:5> based on the third and fourth selection control signals ACTSUMP10 and ACTSUMP15 among the plurality of selection control signals ACTSUMP00, ACTSUMP05, ACTSUMP10, and ACTSUMP15. The detailed process of outputting the internal row signal DT_RAN<0:5> is as follows. In the row output unit 270, the first MUX 271 may output the first rising row address DT_RAN1_M<0:5> when the third selection control signal ACTSUMP10 is disabled. The first MUX 271 may output the delay rising row address DT_RAN_ACT<0:5> when the third selection control signal ACTSUMP10 is enabled. The second MUX 272 of the row output unit 270 may output the first falling row address DT_RANF1_M<0:5> when the fourth selection control signal ACTSUMP15 is disabled. The second MUX 272 of the row output unit 270 may output the delay falling row address DT_RANF_ACT<0:5> when the fourth selection control signal ACTSUMP15 is enabled. As such, the first rising row address DT_RAN1_M<0:5>, the first falling row address DT_RANF1_M<0:5>, the delay rising row address DT_RAN_ACT<0:5>, and the delay falling row address DT_RANF_ACT<0:5> may be sequentially outputted, and therefore the internal row signal DT_RA<0:5> may be outputted within 2 tCK.

The first and second MUXs 281 and 282 of the column output unit 280 may output the power supply voltage VDD when the first and second selection control signals ACTSUMP00 and ACTSUMP05 are enabled. Also, the first and second MUXs 281 and 282 of the column output unit 280 may output the second rising row address DT_RAN2_M<0:5> and the second falling row address DT_RANF2_M<0:5> when the first and second selection control signals ACTSUMP00 and ACTSUMP05 are disabled. Therefore, during the enablement of the first and second selection control signals ACTSUMP00 and ACTSUMP05, the internal column signal DT_CAN<0:5> may keep the logic 'HIGH'. Also, during the disablement of the first and second selection control signals ACTSUMP00 and ACTSUMP05, the column output unit 280 may not output the internal column signal DT_CAN<0:5> although receiving the second rising row address DT_RAN2_M<0:5> and the second falling row address DT_RANF2_M<0:5>.

To sum up, during the test operation to the active command ACTCMD, the semiconductor memory device in accordance with an exemplary embodiment of the present invention may simultaneously receive the first row signal RA1<0:5> and the second row signal RA2<0:5> corresponding to the active command ACTCMD within 1 tCK, and may output the internal row signal DT_RAN<0:5> through 2 tCK.

To this end, the semiconductor memory device in accordance with an exemplary embodiment of the present invention may perform the operation as follows.

The semiconductor memory device may perform the steps of: simultaneously receiving the active command ACTCMD information through the row address pin and the column address pin; shifting the active command ACTCMD information received through the column address pin; generating the internal row signal DT_RAN<0:5> corresponding to the active command ACTCMD information by sequentially outputting the active command ACTCMD information, which is received through the row address pin, and the active command ACTCMD information, which is received through the column address pin and is shifted; and performing the test operation to the active command ACTCMD information in response to the internal row signal DT_RAN<0:5> corresponding to the active command ACTCMD information.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a row input section suitable for receiving a first row signal including a first row command and a first row address, corresponding to an active command, during a test operation of the active command;
   a column input section suitable for receiving a second row signal including a second row address corresponding to the active command during the test operation of the active command; and
   a signal control section suitable for generating an internal row signal for an operation of the active command by transforming the first row signal and the second row signal outputted from the row input section and the column input section.

2. The semiconductor memory device of claim 1, wherein the signal control section includes:
   a first delay unit suitable for generating a plurality of active delay signals, which are sequentially outputted, by delaying the active command by a predetermined amount of time based on a clock signal;
   an active command control unit suitable for generating a plurality of selection control signals, which are sequentially enabled, by performing a logic combination of the plurality of active delay signals;
   a second delay unit suitable for delaying the second row signal by a predetermined amount of time to output a delay row signal;
   a row output unit suitable for outputting one of the first row signal and the delay row signal based on the plurality of selection control signals; and
   a column output unit suitable for outputting one of a power supply voltage and the second row signal based on the plurality of selection control signals.

3. The semiconductor memory device of claim 1, wherein the row input section receives the first row signal through a row address pin.

4. The semiconductor memory device of claim 1, wherein the column input section receives the second row signal through a column address pin.

5. The semiconductor memory device of claim 2, wherein the signal control section further includes:
   a clock control unit suitable for generating a plurality of delay clock signals by delaying the clock signal by a predetermined amount of time based on a test mode signal.

6. The semiconductor memory device of claim 2, wherein the signal control section further includes:
   a command decoding unit suitable for generating the active command based on the first row signal and the second row signal.

7. The semiconductor memory device of claim 1, wherein the row input section receives a third row signal including a second row command except for the active command, and a third row address corresponding to the second row command during a test operation of the second row command except for the active command.

8. The semiconductor memory device of claim 1, wherein the column input section receives a column signal including a column command and a column address during a test operation of the column command.

9. The semiconductor memory device of claim 7, wherein the row input section receives the first and third row signals during a normal operation.

10. The semiconductor memory device of claim 9, further comprising:
a selection section suitable for selecting one of the test operation and the normal operation.

11. A semiconductor memory device comprising:
a memory core section suitable for performing an operation based on a command and an address; and
a signal control section suitable for receiving a part of an active signal through a row address pin and the rest of the active signal a column address pin, transforming the active signal into an internal active signal, and outputting the internal active signal to the memory core section as the command and the address, for a test operation of the active signal,
wherein the active signal includes an active command and an active address corresponding to the active command.

12. The semiconductor memory device of claim 11, wherein the signal control section includes:
a first delay unit suitable for generating a plurality of active delay signals, which are sequentially outputted, by delaying the active command by a predetermined amount of time based on a clock signal;
an active command control unit suitable for generating a plurality of selection control signals, which are sequentially enabled, by performing a logic combination of the plurality of active delay signals;
a second delay unit suitable for delaying the rest of the active signal received through the column address pin by a predetermined amount of time, and outputting a delayed active signal;
a row output unit suitable for outputting one of the part of the active signal received through the row address pin, and the delayed active signal based on the plurality of selection control signals; and
a column output unit suitable for outputting one of a power supply voltage and the rest of the active signal received through the column address pin based on the plurality of selection control signals.

13. The semiconductor memory device of claim 12, wherein the signal control section further includes:
a command decoding unit suitable for generating the active command based on the active signal received through the row address pin and the column address pin.

14. A method of testing a semiconductor memory device comprising:
simultaneously receiving an active command information through a row address pin and a column address pin;
shifting the active command information received through the column address pin;
generating an internal row signal corresponding to the active command information by sequentially outputting the active command information received through the row address pin, and a shifted active command information; and
performing a test operation to the active command information based on the internal row signal corresponding to the active command information.

15. The method of claim 14, wherein the simultaneously receiving of the active command information includes:
receiving a first row signal including a row command and a first row address, corresponding to an active command, through the row address pin; and
receiving a second row signal including a second row address corresponding to the active command through the column address pin.

* * * * *